United States Patent
Agan et al.

(10) Patent No.: US 7,405,599 B2
(45) Date of Patent: Jul. 29, 2008

(54) MAGNETIC TRANSISTOR WITH THE OR/NOR/NAND/AND FUNCTIONS

(75) Inventors: Tom Allen Agan, Saint Paul, MN (US); James Chyi Lai, Saint Paul, MN (US)

(73) Assignee: Northern Lights Semiconductor Corp., Saint Paul, MN (US)

(*) Notice: Subject to any disclaimer, the term of this patent is extended or adjusted under 35 U.S.C. 154(b) by 12 days.

(21) Appl. No.: 11/549,722

(22) Filed: Oct. 16, 2006

(65) Prior Publication Data
US 2007/0152713 A1    Jul. 5, 2007

Related U.S. Application Data

(60) Provisional application No. 60/727,321, filed on Oct. 17, 2005.

(51) Int. Cl.
*H03K 19/20* (2006.01)

(52) U.S. Cl. ................... 326/104; 326/37; 326/136

(58) Field of Classification Search .......... 326/37, 326/104, 136
See application file for complete search history.

(56) References Cited

U.S. PATENT DOCUMENTS

| | | | |
|---|---|---|---|
| 2004/0213042 A1* | 10/2004 | Johnson | 365/158 |
| 2006/0164124 A1* | 7/2006 | Koch et al. | 326/104 |
| 2007/0153568 A1* | 7/2007 | Agan et al. | 365/158 |

* cited by examiner

*Primary Examiner*—Anh Q Tran
(74) *Attorney, Agent, or Firm*—Thomas, Kayden, Horstemeyer, & Risley

(57) ABSTRACT

A magnetic transistor circuit with the OR, NOR, NAND and AND functions has a first, a second, a third, a fourth magnetic transistor, and a routing line. These four magnetic transistors as ordinary transistors that can be turned on or turned off by the control of several metal devices respectively disposed around the magnetic transistors. The OR, NOR, NAND and AND logic functions of the binary system can be implemented by the control of these metal devices.

28 Claims, 4 Drawing Sheets

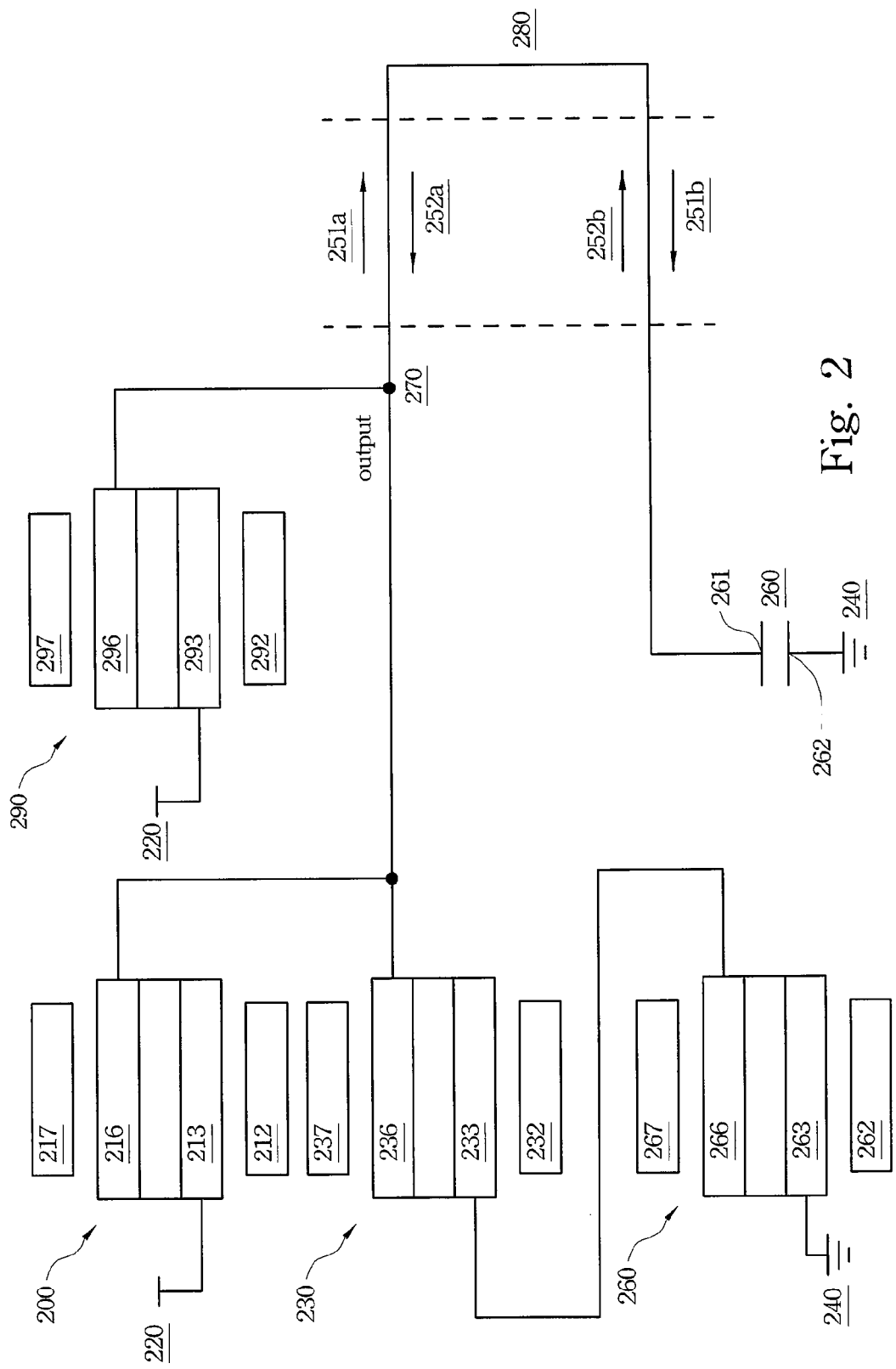

MAGNETIC TRANSISTOR WITH THE OR/NOR/NAND/AND FUNCTIONS

CROSS-REFERENCE TO RELATED APPLICATION

This application claims the priority benefit of provisional application Ser. No. 60/727,321, filed on Oct. 17, 2005, the full disclosure of which is incorporated herein by reference.

BACKGROUND

1. Field of Invention

The present invention relates to an circuit with the OR, NOR, NAND and AND functions. More particularly, the present invention relates to an circuit with the OR, NOR, NAND and AND functions configured by several magnetic transistors.

2. Description of Related Art

'OR', 'NOR', 'NAND', and 'AND' logic circuits are very important for IC circuit design. The designer can combine these four logic circuits each other or with other logic circuits to implement the required functions.

FIG. 1 is a CMOS circuit with the NAND logic function of the prior art. The CMOS circuit has two PMOS transistors 100 and 130 coupled in parallel, and two NMOS transistors 160 and 190 coupled in series. The NMOS transistor 190 couples to the low voltage end 140, and the PMOS transistors 100 and 130 couple to the high voltage end 120. The input signal 'X' at the input end 110 controls the PMOS transistor 100 and NMOS transistor 160. The Input signal 'Y' at the input end 150 controls the PMOS transistor 130 and NMOS transistor 190. The CMOS circuit generates the NAND logic function (output=(X·Y)') at the output end 170.

The Giant Magnetoresistance Effect (GMR) is a quantum mechanical effect observed in structures with alternating thin magnetic and thin nonmagnetic sections. The GMR effect shows a significant change in electrical resistance from the zero-field high resistance state to the high-field low resistance state according to an applied external field.

Therefore, the GMR effect can be used to design the magnetic transistor. Thus, magnetic transistors can further be used to integrate a magnetic circuit without the expensive process and equipment. The magnetic circuit can be designed and manufactured with short programming time and high density.

Moreover, each ordinary logic circuit has only one function individually. Therefore, the ordinary circuits have to be designed or manufactured seperately to implement a function. The magnetic transistor circuit presented here can generate the OR, NOR, NAND and AND functions by the same circuit. Therefore, the design and manufacture cost can be reduced more than before.

For the foregoing reasons, there is a need to have a magnetic transistor circuit integrated by magnetic transistors.

SUMMARY

It is therefore an aspect of the present invention to provide a magnetic transistor circuit with the OR, NOR, NAND and AND functions implemented by magnetic transistors.

According to one preferred embodiment of the present invention, the magnetic transistor circuit has a first, a second, a third, a fourth magnetic transistor, and a routing line. The first magnetic transistor has a first magnetic section and a second magnetic section, wherein the first magnetic section couples to a high voltage end, and the second magnetic section couples to an output end. The second magnetic transistor has a third magnetic section and a fourth magnetic section, wherein the fourth magnetic section couples to the second magnetic section of the first magnetic transistor and the output end. The third magnetic transistor has a fifth magnetic section and a sixth magnetic section, wherein the fifth magnetic section couples to a low voltage end, and the sixth magnetic section couples to the third magnetic section of the second magnetic transistor. The fourth magnetic transistor has a seventh magnetic section and an eighth magnetic section, wherein the seventh magnetic section couples to the high voltage end, and the eighth magnetic section couples to the second magnetic section of the first magnetic transistor, the fourth magnetic section of the second magnetic transistor and the output end. The routing line couples to the output end and has a current going through in a first current direction or a second current direction, wherein the first current direction and the second current direction are opposite to represent the data '1' and the data '0' respectively.

It is to be understood that both the foregoing general description and the following detailed description are by examples, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

FIG. 2 is the magnetic transistor circuit according to the embodiment of this invention.

DESCRIPTION OF THE PREFERRED EMBODIMENTS

Figure 1:
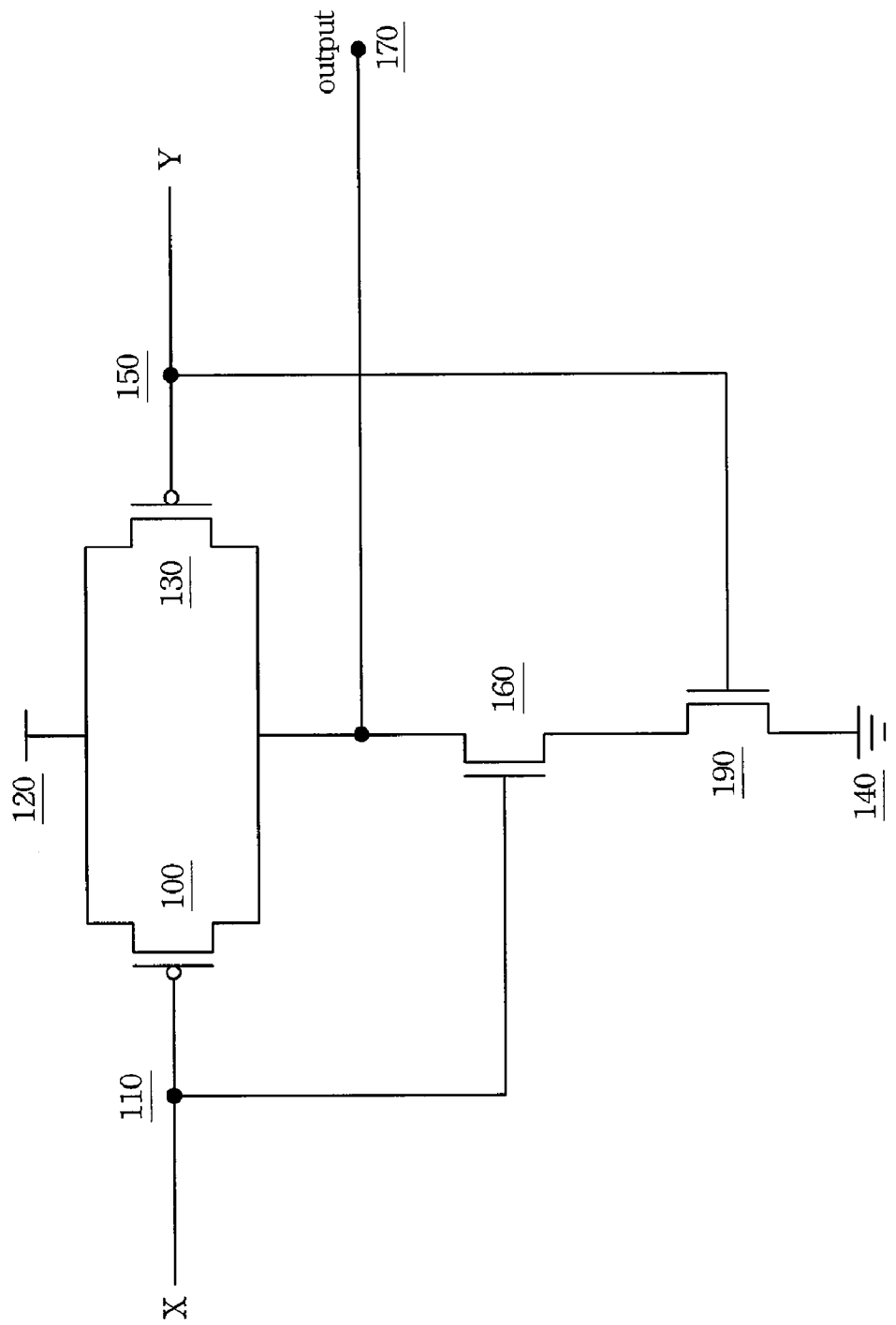
FIG. 1 is a CMOS circuit with the NAND logic function of the prior art.

Reference will now be made in detail to the present preferred embodiments of the invention, examples of which are illustrated in the accompanying drawings. Wherever possible, the same reference numbers are used in the drawings and the description to refer to the same or like parts.

All figures are drawn for ease of explanation of the basic teachings of the present invention only; the extensions of the figures with respect to number, position, relationship, and dimensions of the parts to form the embodiment will be explained or will be within the skill of the art after the following description has been read and understood. Further, the exact dimensions and dimensional proportions to conform to specific force, weight, strength, and similar requirements will likewise be within the skill of the art after the following description has been read and understood.

FIG. 2 is the magnetic transistor circuit according to the embodiment of this invention. The magnetic transistor circuit has a first magnetic transistor 200, a second magnetic transistor 230, a third magnetic transistor 260, a fourth magnetic transistor 290, and a routing line 280. The first magnetic transistor 200 has a first magnetic section 213 and a second magnetic section 216, wherein the first magnetic section 213 couples to a high voltage end 220, and the second magnetic section 216 couples to an output end 270. The second magnetic transistor 230 has a third magnetic section 233 and a fourth magnetic section 236, wherein the fourth magnetic section 236 couples to the second magnetic section 216 and the output end 270. The third magnetic transistor 260 has a fifth magnetic section 263 and a sixth magnetic section 266, wherein the fifth magnetic section 263 couples to a low voltage end 240, and the sixth magnetic section 266 couples to the third magnetic section 233 of the second magnetic transistor 230. The fourth magnetic transistor 290 has a seventh magnetic section 293 and an eighth magnetic section 296, wherein the seventh magnetic section 293 couples to the high voltage end 220, and the eighth magnetic section 296 couples to the second magnetic section 216 of the first magnetic transistor 200, the fourth magnetic section 236 of the second magnetic transistor 230 and the output end 270. The routing line 280 couples to the output end 270 and has a current going through in a first current direction 251a or a second current direction 252a, wherein the first current direction 251a and the second current direction 252a are opposite to represent the data '1' and the data '0' respectively.

The magnetic transistor circuit with the OR, NOR, NAND and AND functions further comprises a capacitor 260 coupled between the routing line 280 and the low voltage end 240. Thus, the capacitor 260 couples to the routing line 280 at the end 261, and couples to the low voltage end 240 at the end 262.

Since the magnetic transistor circuit just needs only a current pulse to control the current direction, once the current pulse has gone through the routing line 280, the current direction is set and the data '1' or '0' of the binary system is defined, even if the power is removed. A current pulse can be created by having a capacitor at the far end of the routing line 280. This allows the voltage on the routing line 280 is still the same as in standard CMOS. A high voltage to charge the capacitor 160 is a logic high (data '1' of the binary system), a low voltage charge on the capacitor is a logic low (data '0' of the binary system). Therefore, the magnetic transistor circuit is operable with standard CMOS circuit.

The symbols '→' and '←' are just arranged to respectively represent the first current direction 251a and the second current direction 252a, not arranged to restrict the current directions. Therefore, the first current direction can be from the output end 270 to the capacitor 260, and the second current direction can be from the capacitor 260 to the output end 270. On the contrary, the second current direction can be from the output end 270 to the capacitor 260, and the first current direction can be from capacitor 260 to the output end 270.

Otherwise, the first current direction 251a and the second current direction 252a can be opposite to respectively represent the data '0' and the data '1' by routing the routing line 280 in the opposite direction. When we route the routing line 280 in the opposite direction, we can get the current directions 251b and 252b. The current directions 251b is opposite to the first current direction 251a, and the current directions 252b is opposite to the second current direction 252a. Thus, we can get the different data by routing the routing line 280 in the opposite direction. For example, if we define the first current direction 251a(→) to be the data '1' of the binary system, we can get the data '0' of the binary system from the current direction 251b(←) in the opposite direction of the routing line 280.

The magnetic transistor circuit further comprises a plurality of metal devices 212, 217, 232, 237, 262, 267, 292 and 297 respectively disposed around the magnetic sections 213, 216, 233, 236, 263, 266, 293 and 296. The metal devices 212, 217, 232, 237, 262, 167, 292 and 297 are arranged to respectively control dipoles of the magnetic sections 213, 216, 233, 236, 263, 266, 293 and 296. For example, the first magnetic transistor 200 has metal devices 212 and 217 respectively disposed around the magnetic sections 213 and 216. The metal device 212 is arranged to control the dipole of the magnetic section 213, and the metal device 217 is arranged to control the dipole of the magnetic section 216.

When dipoles of these two magnetic sections of one magnetic transistor are the same, these two magnetic sections of one magnetic transistor are conductive; when dipoles of these two magnetic sections of one magnetic transistor are different, these two magnetic sections of one magnetic transistor are not conductive. Therefore, the designer can use the metal devices to control the dipoles of the magnetic sections. The designer can further use the dipoles of these two magnetic sections of one magnetic transistor to control the conductivity between these two magnetic sections.

For example, when dipoles of the first magnetic section 213 and the second magnetic section 216 are the same, the first magnetic section 213 and the second magnetic section 216 are conductive, when dipoles of the first magnetic section 213 and the second magnetic section 216 are different, the first magnetic section 213 and the second magnetic section 216 are not conductive.

By the description above, characteristics of the magnetic transistor can be used to implement a circuit with some logic functions.

Figure 2A:
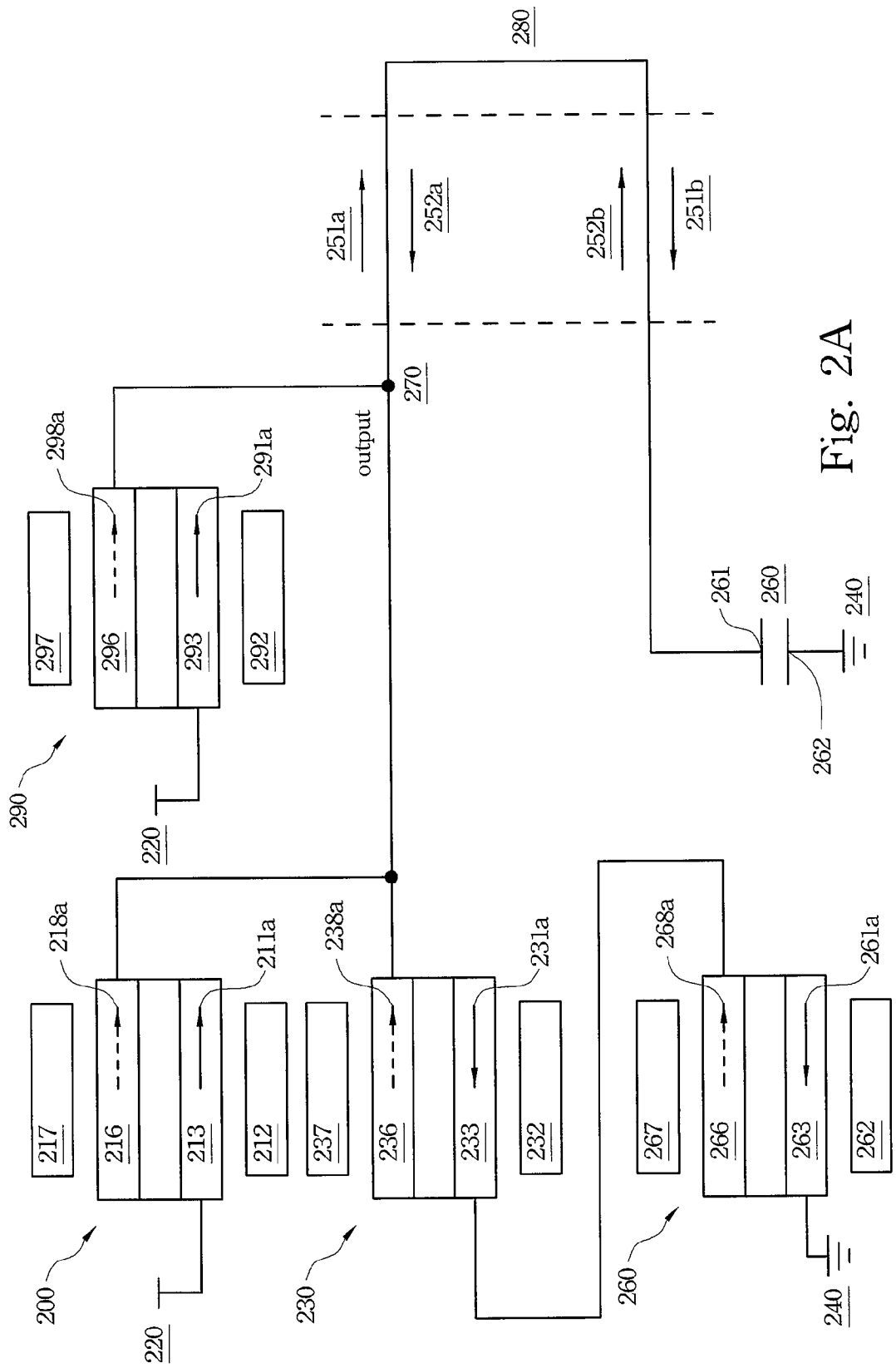
FIG. 2A is the magnetic transistor circuit operating the logic functions of the binary system according to the embodiment of this invention.

FIG. 2A is the magnetic transistor circuit operating the logic functions of the binary system according to the embodiment of this invention. The dipoles 211a and 291a of the first and seventh magnetic sections 213 and 293 are a first dipole, and dipoles 231a and 261a of the third and fifth magnetic sections 233 and 263 are a second dipole. Therefore, the magnetic transistor circuit can generate different data at the output end 270 or the routing line 280 by changing the dipoles 218a, 238a, 268a and 298a of the second, fourth, sixth, and eighth magnetic sections 216, 236, 266, and 296.

The magnetic ransistorcircuit of FIG. 2A has OR logic function of the binary system as describe bellow.

The OR logic function is:

output=$X+Y$

The truth table of the OR logic function of the binary system according to the embodiment of this invention is:

| output | Dipole Y = 1(→) | Dipole Y = 0(←) |
|---|---|---|
| Dipole X = 1(→) | 1 | 1 |
| Dipole X = 0(←) | 1 | 0 |

Wherein 'output' is the data outputted at the output end 270 or the routing line 280, 'X' is dipoles of the magnetic sections 216 and 236, 'Y' is dipoles of the magnetic sections 266 & 296. The symbols '→' and '←' are arranged to respectively represent the first dipole and the second dipole. How to use dipoles of X (dipoles of the magnetic sections 216 and 236) and Y (dipoles of the magnetic sections 266 and 296) to create the OR logic function is described as below.

When dipoles 218a, 238a, 268a, and 298a of the second, fourth, sixth and eighth magnetic sections 216, 236, 266, and 296 at FIG. 2A are the first dipole (→) that represents data '1' of the binary system, the routing line 280 has a current going through in the first current direction 251a that represents data '1' of the binary system.

When dipoles of the second and fourth magnetic sections 216 and 236 are the first dipole (→) that represents data '1' of the binary system, and dipoles of the sixth and eighth magnetic sections 266 and 296 are the second dipole (←) that represents data '0' of the binary system, the routing line 280 has a current going through in the first current direction 251a that represents data '1' of the binary system (not shown).

When dipoles of the second and fourth magnetic sections 216 and 236 are the second dipole (←) that represents data '0' of the binary system, and dipoles of the sixth and eighth magnetic sections 266 and 296 are the first dipole (→) that represents data '1' of the binary system, the routing line 280 has a current going through in the first current direction 251a that represents data '1' of the binary system (not shown).

When dipoles of the second, fourth, sixth and eighth magnetic sections 216, 236, 266, 296 are the second dipole (←) that represents data '0' of the binary system, the routing line 280 has a current going through in the second current direction 252a that represents data '0' of the binary system (not shown).

The magnetic ransistorcircuit of FIG. 2A has NOR logic function of the binary system as describe below.

The NOR logic function is:

output=(X+Y)'

The truth table of the NOR logic function of the binary system according to the embodiment of this invention is:

| output | Dipole Y = 1(→) | Dipole Y = 0(←) |
|---|---|---|
| Dipole X = 1(→) | 0 | 0 |
| Dipole X = 0(←) | 0 | 1 |

WE can find that the outputs of the NOR and the OR logic functions are inverse. Therefore, we can use the current directions (251b and 252b) of the routing line 280 in the opposite direction to represent the data of the NOR logic function. The magnetic transistor circuit can operate OR or NOR logic function by the same device without an inverter. On the contrary, the ordinary CMOS circuit with OR logic function needs an extra inverter combined to the CMOS circuit with NOR function.

Therefore, we can use the circuit to get the NOR logic function. Even more, we can use the same dipoles 218a, 238a, 268a and 298a of the second, fourth, sixth, and eighth magnetic sections 216, 236, 266, and 296 of OR logic function to get the NOR logic function.

When dipoles 218a, 238a, 268a, and 298a of the second, fourth, sixth and eighth magnetic sections 216, 236, 266, and 296 at FIG. 2A are the first dipole (→) that represents data '1' of the binary system, the routing line 280 in the opposite direction has a current going through in the second current direction 251b that represents data '0' of the binary system.

When dipoles of the second and fourth magnetic sections 216 and 236 are the first dipole (→) that represents data '1' of the binary system, and dipoles of the sixth and eighth magnetic sections 266 and 296 are the second dipole (←) that represents data '0' of the binary system, the routing line 280 in the opposite direction has a current going through in the second current direction 251b that represents data '0' of the binary system (not shown).

When dipoles of the second and fourth magnetic sections 216 and 236 are the second dipole (←) that represents data '0' of the binary system, and dipoles of the sixth and eighth magnetic sections 266 and 296 are the first dipole (→) that represents data '1' of the binary system, the routing line 280 in the opposite direction has a current going through in the second current direction 251b that represents data '0' of the binary system (not shown).

When dipoles of the second, fourth, sixth and eighth magnetic sections 216, 236, 266, 296 are the second dipole (←) that represents data '0' of the binary system, the routing line 280 in the opposite direction has a current going through in the first current direction 252b that represents data '1' of the binary system (not shown).

Figure 2B:
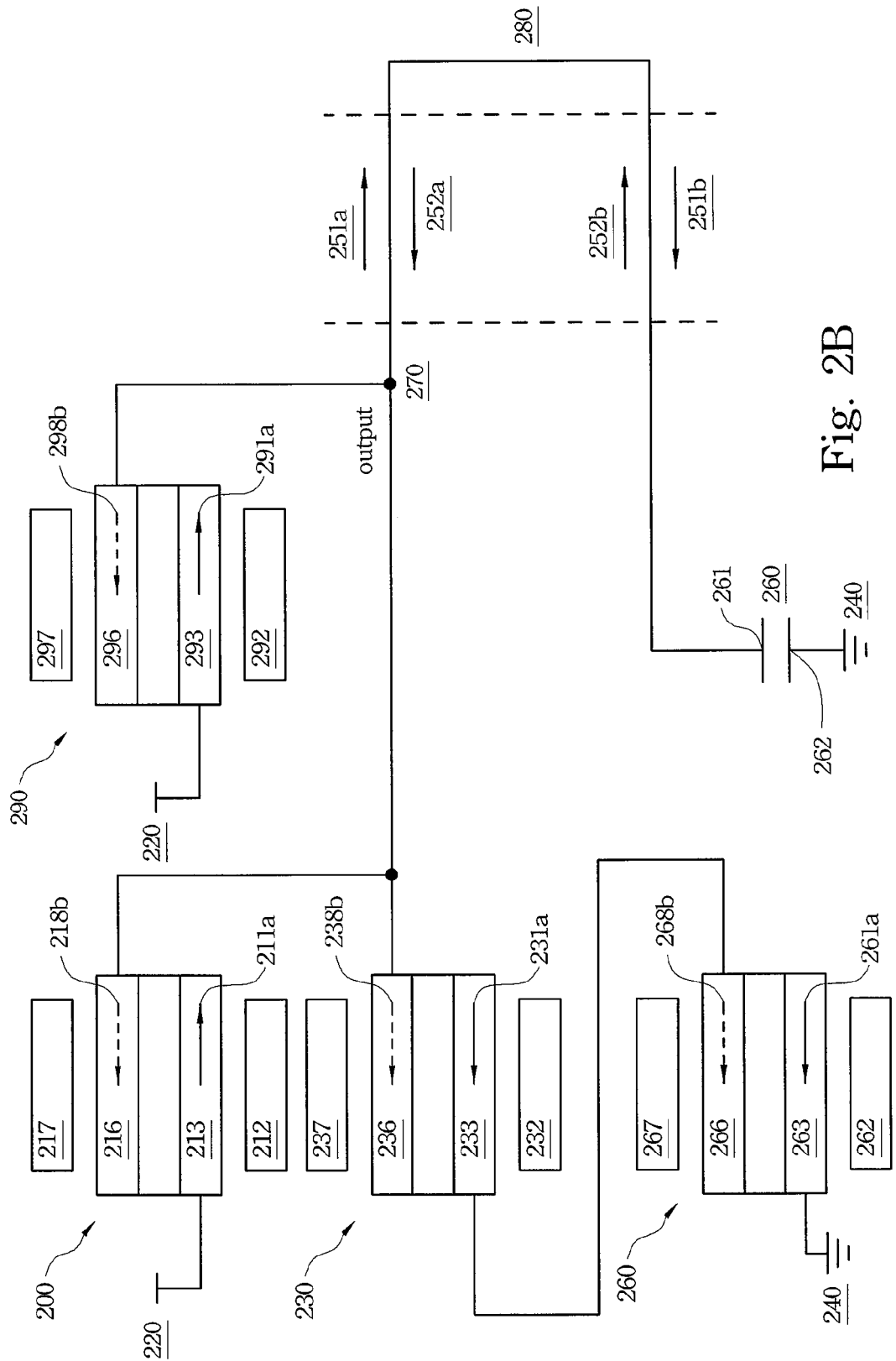
FIG. 2B is the magnetic transistor circuit operating another logic functions of the binary system according to the embodiment of this invention.

FIG. 2B is the magnetic transistor circuit operating another logic functions of the binary system according to the embodiment of this invention. The dipoles 211a and 291a of the first and seventh magnetic sections 213 and 293 are a first dipole, and dipoles 231a and 261a of the third and fifth magnetic sections 233 and 263 are a second dipole. Therefore, the magnetic transistor circuit can generate different data at the output end 270 or the routing line 280 by changing the dipoles 218b, 238b, 268b and 298b of the second, fourth, sixth, and eighth magnetic sections 216, 236, 266, and 296.

The magnetic transistor circuit of FIG. 2B has NAND logic function of the binary system as describe bellow.

The NAND logic function is:

output=(X·Y)'

The truth table of NAND logic function of the binary system according to the embodiment of this invention is:

| output | Dipole Y = 1(←) | Dipole Y = 0(→) |
|---|---|---|
| Dipole X = 1(←) | 0 | 1 |
| Dipole X = 0(→) | 1 | 1 |

When dipoles 218b, 238b, 268b, and 298b of the second, fourth, sixth and eighth magnetic sections 216, 236, 266, and 296 at FIG. 2B are the second dipole (←) that represents data '1' of the binary system, the routing line 280 has a current going through in the second current direction 252a that represents data '0' of the binary system.

When dipoles of the second and fourth magnetic sections 216 and 236 are the second dipole (←) that represents data '1' of the binary system, and dipoles of the sixth and eighth magnetic sections 266 and 296 are the first dipole (→) that represents data '0' of the binary system, the routing line 280 has a current going through in the first current direction 251a that represents data '1' of the binary system (not shown).

When dipoles of the second and fourth magnetic sections 216 and 236 are the first dipole (→) that represents data '0' of the binary system, and dipoles of the sixth and eighth magnetic sections 266 and 296 are the second dipole (←) that represents data '1' of the binary system, the routing line 280 has a current going through in the first current direction 251a that represents data '1' of the binary system (not shown).

When dipoles of the second, fourth, sixth and eighth magnetic sections 216, 236, 266, 296 are the first dipole (→) that represents data '0' of the binary system, the routing line 280 has a current going through in the first current direction 251a that represents data '1'0 of the binary system (not shown).

The magnetic transistor circuit of FIG. 2B has AND logic function of the binary system as describe bellow.

The AND logic function is:

output=X·Y

The truth table of AND logic function of the binary system according to the embodiment of this invention is:

| output | Dipole Y = 1(←) | Dipole Y = 0(→) |
| --- | --- | --- |
| Dipole X = 1(←) | 1 | 0 |
| Dipole X = 0(→) | 0 | 0 |

WE can find that the outputs of the AND and the NAND logic functions are inverse. Therefore, we can use the current directions (251b and 252b) of the routing line 280 in the opposite direction to represent the data of the AND logic function. The magnetic transistor circuit can operate AND or NAND logic function by the same device without an inverter. On the contrary, the ordinary CMOS circuit with AND logic function needs an extra inverter combined to the CMOS circuit with NAND function.

Therefore, we can use the circuit to get the AND logic function. Even more, we can use the same dipoles 218b, 238b, 268b and 298b of the second, fourth, sixth, and eighth magnetic sections 216, 236, 266, and 296 of NAND logic function to get the AND logic function.

When dipoles 218b, 238b, 268b, and 298b of the second, fourth, sixth and eighth magnetic sections 216, 236, 266, and 296 at FIG. 2B are the second dipole (←) that represents data '1' of the binary system, the routing line 280 in the opposite direction has a current going through in the first current direction 252b that represents data '1' of the binary system.

When dipoles of the second and fourth magnetic sections 216 and 236 are the second dipole (←) that represents data '1' of the binary system, and dipoles of the sixth and eighth magnetic sections 266 and 296 are the first dipole (→) that represents data '0' of the binary system, the routing line 280 in the opposite direction has a current going through in the second current direction 251b that represents data '0' of the binary system (not shown).

When dipoles of the second and fourth magnetic sections 216 and 236 are the first dipole (→) that represents data '0' of the binary system, and dipoles of the sixth and eighth magnetic sections 266 and 296 are the second dipole (←) that represents data '1' of the binary system, the routing line 280 in the opposite direction has a current going through in the second current direction 251b that represents data '0' of the binary system (not shown).

When dipoles of the second, fourth, sixth and eighth magnetic sections 216, 236, 266, 296 are the first dipole (→) that represents data '0' of the binary system, the routing line 280 in the opposite direction has a current going through in the second current direction 251b that represents data '0' of the binary system (not shown).

In order to corporate with the ordinary integrated circuits of semiconductor, a voltage of the low voltage end 240 is about 0 volt, and a voltage of the high voltage end 220 is about 2.5 volt, 3.3 volt or 5 volt.

The symbols '→' and '←' here are just arranged to respectively represent the dipoles of the magnetic sections, not arranged to restrict the dipole directions. In the magnetic transistor circuit, each magnetic transistor has a conductive section between two magnetic sections. The conductivity of the conductive section can be controlled by the dipoles of these two magnetic sections. Therefore, the magnetic transistor circuit with the logic functions can be implemented by the description above.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A magnetic transistor circuit with OR, NOR, NAND and AND functions, comprising:
    a first magnetic transistor having a first magnetic section and a second magnetic section, wherein the first magnetic section couples to a high voltage end, and the second magnetic section couples to an output end;
    a second magnetic transistor having a third magnetic section and a fourth magnetic section, wherein the fourth magnetic section couples to the second magnetic section of the first magnetic transistor and the output end;
    a third magnetic transistor having a fifth magnetic section and a sixth magnetic section, wherein the fifth magnetic section couples to a low voltage end, and the sixth magnetic section couples to the third magnetic section of the second magnetic transistor;
    a fourth magnetic transistor having a seventh magnetic section and a eighth magnetic section, wherein the seventh magnetic section couples to the high voltage end, and the eighth magnetic section couples to the second magnetic section of the first magnetic transistor, the fourth magnetic section of the second magnetic transistor and the output end; and
    a routing line coupling to the output end and having a current going through in a first current direction or a second current direction, wherein the first current direction and the second current direction are opposite to represent the data '1' and the data '0' respectively.

2. The magnetic transistor circuit with the OR, NOR, NAND and AND functions of claim 1, further comprising a capacitor coupled between the routing line and the low voltage end.

3. The magnetic transistor circuit with the OR, NOR, NAND and AND functions of claim 1, wherein the first current direction is from the output end to the capacitor, and the second current direction is from the capacitor to the output end.

4. The magnetic transistor circuit with the OR, NOR, NAND and AND functions of claim 1, wherein the second current direction is from the output end to the capacitor, and the first current direction is from the capacitor to the output end.

5. The magnetic transistor circuit with the OR, NOR, NAND and AND functions of claim 1, further comprising a plurality of metal devices respectively disposed around the magnetic sections, wherein the metal devices are arranged to respectively control dipoles of the magnetic sections.

6. The magnetic transistor circuit with the OR, NOR, NAND and AND functions of claim 1, wherein when dipoles of these two magnetic sections of one magnetic transistor are the same, these two magnetic sections of one magnetic transistor are conductive; when dipoles of these two magnetic sections of one magnetic transistor are different, these two magnetic sections of one magnetic transistor are not conductive.

7. The magnetic transistor circuit with the OR, NOR, NAND and AND functions of claim 1, wherein dipoles of the first and seventh magnetic sections are a first dipole, and dipoles of the third and fifth magnetic sections are a second dipole.

8. The magnetic transistor circuit with the OR, NOR, NAND and AND functions of claim 1, wherein the magnetic transistor circuit has the OR logic function of the binary system.

9. The magnetic transistor circuit with the OR, NOR, NAND and AND functions of claim 8, wherein when dipoles of the second, fourth, sixth and eighth magnetic sections are the first dipole that represents data '1' of the binary system, the routing line has a current going through in the first current direction that represents data '1' of the binary system.

10. The magnetic transistor circuit with the OR, NOR, NAND and AND functions of claim 8, wherein when dipoles of the second and fourth magnetic sections are the first dipole that represents data '1' of the binary system, and dipoles of the sixth and eighth magnetic sections are the second dipole that represents data '0' of the binary system, the routing line has a current going through in the first current direction that represents data '1' of the binary system.

11. The magnetic transistor circuit with the OR, NOR, NAND and AND functions of claim 8, wherein when dipoles of the second and fourth magnetic sections are the second dipole that represents data '0' of the binary system, and dipoles of the sixth and eighth magnetic sections are the first dipole that represents data '1' of the binary system, the routing line has a current going through in the first current direction that represents data '1' of the binary system.

12. The magnetic transistor circuit with the OR, NOR, NAND and AND functions of claim 8, wherein when dipoles of the second, fourth, sixth and eighth magnetic sections are the second dipole that represents data '0' of the binary system, the routing line has a current going through in the second current direction that represents data '0' of the binary system.

13. The magnetic transistor circuit with the OR, NOR, NAND and AND functions of claim 1, wherein the magnetic transistor circuit has the NOR logic function of the binary system.

14. The magnetic transistor circuit with the OR, NOR, NAND and AND functions of claim 1, wherein the first current direction and the second current direction are opposite to respectively represent the data '0' and the data '1' by routing the routing line in the opposite direction.

15. The magnetic transistor circuit with the OR, NOR, NAND and AND functions of claim 13, wherein when dipoles of the second, fourth, sixth and eighth magnetic sections are the first dipole that represents data '1' of the binary system, the routing line in the opposite direction has a current going through in the second current direction that represents data '0' of the binary system.

16. The magnetic transistor circuit with the OR, NOR, NAND and AND functions of claim 13, wherein when dipoles of the second and fourth magnetic sections are the first dipole that represents data '1' of the binary system, and dipoles of the sixth and eighth magnetic sections are the second dipole that represents data '0' of the binary system, the routing line in the opposite direction has a current going through in the second current direction that represents data '0' of the binary system.

17. The magnetic transistor circuit with the OR, NOR, NAND and AND functions of claim 13, wherein when dipoles of the second and fourth magnetic sections are the second dipole that represents data '0' of the binary system, and dipoles of the sixth and eighth magnetic sections are the first dipole that represents data '1' of the binary system, the routing line in the opposite direction has a current going through in the second current direction that represents data '0' of the binary system.

18. The magnetic transistor circuit with the OR, NOR, NAND and AND functions of claim 13, wherein when dipoles of the second, fourth, sixth and eighth magnetic sections are the second dipole that represents data '0' of the binary system, the routing line in the opposite direction has a current going through in the first current direction that represents data '1' of the binary system.

19. The magnetic transistor circuit with the OR, NOR, NAND and AND functions of claim 1, wherein the magnetic transistor circuit has NAND logic function of the binary system.

20. The magnetic transistor circuit with the OR, NOR, NAND and AND functions of claim 19, wherein when dipoles of the second, fourth, sixth and eighth magnetic sections are the second dipole that represents data '1' of the binary system, the routing line has a current going through in the second current direction that represents data '0' of the binary system.

21. The magnetic transistor circuit with the OR, NOR, NAND and AND functions of claim 19, wherein when dipoles of the second and fourth magnetic sections are the second dipole that represents data '1' of the binary system, and dipoles of the sixth and eighth magnetic sections are the first dipole that represents data '0' of the binary system, the routing line has a current going through in the first current direction that represents data '1' of the binary system.

22. The magnetic transistor circuit with the OR, NOR, NAND and AND functions of claim 19, wherein when dipoles of the second and fourth magnetic sections are the first dipole that represents data '0' of the binary system, and dipoles of the sixth and eighth magnetic sections are the second dipole that represents data '1' of the binary system, the routing line has a current going through in the first current direction that represents data '1' of the binary system.

23. The magnetic transistor circuit with the OR, NOR, NAND and AND functions of claim 19, wherein when dipoles of the second, fourth, sixth and eighth magnetic sections are the first dipole that represents data '0' of the binary system, the routing line has a current going through in the first current direction that represents data '1' of the binary system.

24. The magnetic transistor circuit with the OR, NOR, NAND and AND functions of claim 1, wherein the magnetic transistor circuit has AND logic function of the binary system.

25. The magnetic transistor circuit with the OR, NOR, NAND and AND functions of claim 24, wherein when dipoles of the second, fourth, sixth and eighth magnetic sections are the second dipole that represents data '1' of the binary system, the routing line in the opposite direction has a current going through in the first current direction that represents data '1' of the binary system.

26. The magnetic transistor circuit with the OR, NOR, NAND and AND functions of claim 24, wherein when dipoles of the second and fourth magnetic sections are the second dipole that represents data '1' of the binary system, and dipoles of the sixth and eighth magnetic sections are the first dipole that represents data '0' of the binary system, the routing line in the opposite direction has a current going through in the second current direction that represents data '0' of the binary system.

27. The magnetic transistor circuit with the OR, NOR, NAND and AND functions of claim 24, wherein when dipoles of the second and fourth magnetic sections are the first dipole that represents data '0' of the binary system, and dipoles of the sixth and eighth magnetic sections are the second dipole that represents data '1' of the binary system, the routing line in the opposite direction has a current going through in the second current direction that represents data '0' of the binary system.

28. The magnetic transistor circuit with the OR, NOR, NAND and AND functions of claim 24, wherein when dipoles of the second, fourth, sixth and eighth magnetic sections are the first dipole that represents data '0' of the binary system, the routing line in the opposite direction has a current going through in the second current direction that represents data '0' of the binary system.

* * * * *

UNITED STATES PATENT AND TRADEMARK OFFICE
CERTIFICATE OF CORRECTION

PATENT NO. : 7,405,599 B2  Page 1 of 1
APPLICATION NO. : 11/549722
DATED : July 29, 2008
INVENTOR(S) : Agan et al.

It is certified that error appears in the above-identified patent and that said Letters Patent is hereby corrected as shown below:

On the cover page, item (54), and col. 1, line 1, the title should be changed to read "MAGNETIC TRANSISTOR CIRCUIT WITH THE OR/NOR/NAND/AND FUNCTIONS"

Signed and Sealed this

Seventeenth Day of February, 2009

JOHN DOLL
*Acting Director of the United States Patent and Trademark Office*